(12) United States Patent
Hwang

(10) Patent No.: US 7,795,065 B2
(45) Date of Patent: Sep. 14, 2010

(54) IMAGE SENSOR AND MANUFACTURING METHOD THEREOF

(75) Inventor: Joon Hwang, Cheongju-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 12/689,598

(22) Filed: Jan. 19, 2010

(65) Prior Publication Data

US 2010/0112745 A1      May 6, 2010

Related U.S. Application Data

(62) Division of application No. 12/204,914, filed on Sep. 5, 2008, now Pat. No. 7,675,101.

(30) Foreign Application Priority Data

Sep. 7, 2007    (KR) ...................... 10-2007-0090979
Jul. 25, 2008    (KR) ...................... 10-2008-0073161

(51) Int. Cl.
*H01L 21/00* (2006.01)

(52) U.S. Cl. .............................. 438/59; 438/58; 438/60; 257/292; 257/294; 257/E27.133

(58) Field of Classification Search ................. 257/292, 257/294, E27.133; 438/58, 59, 60
See application file for complete search history.

(56) References Cited

U.S. PATENT DOCUMENTS 5,936,261 A      8/1999    Ma et al.

6,396,118 B1      5/2002    Theil et al.
2007/0018266 A1      1/2007    Dupont et al.

FOREIGN PATENT DOCUMENTS

| CN | 1922732 A | 2/2007 |
|---|---|---|
| KR | 10-2006-0077082 | 7/2006 |

*Primary Examiner*—Tan N Tran
(74) *Attorney, Agent, or Firm*—Saliwanchik, Lloyd & Saliwanchik

(57) ABSTRACT

Provided is an image sensor. The image sensor can include a first substrate comprising a pixel portion in which a readout circuitry is provided and a peripheral portion in which a peripheral circuitry is provided. An interlayer dielectric including lines can be formed on the first substrate to connect with the readout circuitry and the peripheral circuitry. A crystalline semiconductor layer can be provided on a portion of the interlayer dielectric corresponding to the pixel portion through a bonding process. The crystalline semiconductor layer can include a first photodiode and second photodiode. The first and second photodiodes can be defined by device isolation trenches in the crystalline semiconductor layer. A device isolation layer can be formed on the crystalline semiconductor layer comprising the device isolation trenches. An upper electrode layer passes through the device isolation layer to connect with a portion of the first photodiode. An expose portion can be formed in the upper electrode layer to selectively expose an upper region of the first photodiode. A passivation layer can be formed on the first substrate on which the expose portion is provided.

9 Claims, 17 Drawing Sheets

IMAGE SENSOR AND MANUFACTURING METHOD THEREOF

CROSS-REFERENCE TO RELATED APPLICATIONS

This application is a divisional of U.S. application Ser. No. 12/204,914, filed Sep. 5, 2008, now U.S. Pat. No. 7,675,101 which claims the benefit under 35 U.S.C. §119 of Korean Patent Application Nos. 10-2007-0090979, filed Sep. 7, 2007 and 10-2008-0073161, filed Jul. 25, 2008, which are hereby incorporated by reference in their entirety.

BACKGROUND

An image sensor is a semiconductor device for converting an optical image into an electrical signal. The image sensor is roughly classified as a charge coupled device (CCD) image sensor or a complementary metal oxide semiconductor (CMOS) image sensor (CIS).

Generally, a photodiode of an image sensor is formed in a substrate with readout circuitry by ion implantation. However, as the size of a photodiode reduces more and more for the purpose of increasing the number of pixels without an increase in a chip size, the area of a light receiving portion reduces, so that an image quality reduces.

Also, since a stack height does not reduce as much as the reduction in the area of the light receiving portion, the number of photons incident to the light receiving portion also reduces due to diffraction of light, called airy disk.

As an alternative to overcome this limitation, an attempt of forming a photodiode using amorphous silicon (Si), or forming a readout circuitry in a Si substrate and forming a photodiode on the readout circuitry using a method such as wafer-to-wafer bonding has been made (referred to as a "three-dimensional (3D) image sensor). The photodiode is connected with the readout circuitry through a metal line.

According to a related art, device isolation between pixels is not completely made.

Also, according to a related art image sensor, a leakage current may be generated due to peripheral factors such as a line and temperature, which can cause a dark current.

Also, according to a related art, since both the source and the drain of the transfer transistor are heavily doped with n-type impurities, a charge sharing phenomenon occurs as illustrated in FIG. 19. When the charge sharing phenomenon occurs, the sensitivity of an output image is reduced and an image error may be generated.

Also, according to the related art, because a photo charge does not readily move between the photodiode and the readout circuitry, a dark current is generated or saturation and sensitivity reduce.

BRIEF SUMMARY

Embodiments of the present invention relate to an image sensor and method for manufacturing the same.

According to an embodiment, an image sensor is provided that can include: a first substrate comprising a pixel portion in which a readout circuitry is provided and a peripheral portion in which a peripheral circuitry is provided; an interlayer dielectric on the first substrate, the interlayer dielectric comprising first lines connected with the readout circuitry and a second line connected with the peripheral circuitry; a crystalline semiconductor layer on a portion of the interlayer dielectric corresponding to the pixel portion; a first photodiode and a second photodiode in the crystalline semiconductor layer, the first photodiode and the second photodiode separated by device isolation trenches, the first photodiode and the second photodiode connected to respective ones of the first lines; a device isolation layer on the crystalline semiconductor layer including in the device isolation trenches; an upper electrode layer passing through the device isolation layer on the crystalline semiconductor layer to connect with a portion of the first photodiode; an expose portion in the upper electrode layer, the expose portion selectively exposing an upper region of the first photodiode; and a passivation layer on the first substrate on which the expose portion is provided.

In a further embodiment, a dummy pixel can be provided at an edge of a pixel portion of a chip. This dummy pixel can be used for testing.

In addition, a method for manufacturing an image sensor can include: forming a readout circuitry on a pixel portion of a first substrate, and a peripheral circuitry on a peripheral portion of the first substrate; forming an interlayer dielectric including first lines connected with the readout circuitry and a second line connected with the peripheral circuitry on the first substrate; forming a second substrate comprising a crystalline semiconductor layer; forming a photodiode layer in the crystalline semiconductor layer; bonding the first substrate with the second substrate comprising the photodiode layer; removing a portion of the second substrate to expose the photodiode layer on the first substrate; forming device isolation trenches in the crystalline semiconductor layer separating regions of the photodiode layer to form a first photodiode and a second photodiode respectively connected with the first lines; forming a device isolation layer on the crystalline semiconductor layer including in the device isolation trenches; forming an upper electrode layer on the device isolation layer such that the upper electrode layer is connected with a portion of the first photodiode; removing a portion of the upper electrode layer to form an expose portion selectively exposing an upper region of the first photodiode; and forming a passivation layer on the interlayer dielectric on which the expose portion is formed.

The details of one or more embodiments are set forth in the accompanying drawings and the description below. Other features will be apparent from the description and drawings, and from the claims.

DETAILED DESCRIPTION

Embodiments of an image sensor according and a manufacturing method thereof will be described in detail with reference to the accompanying drawings.

Figure 16:
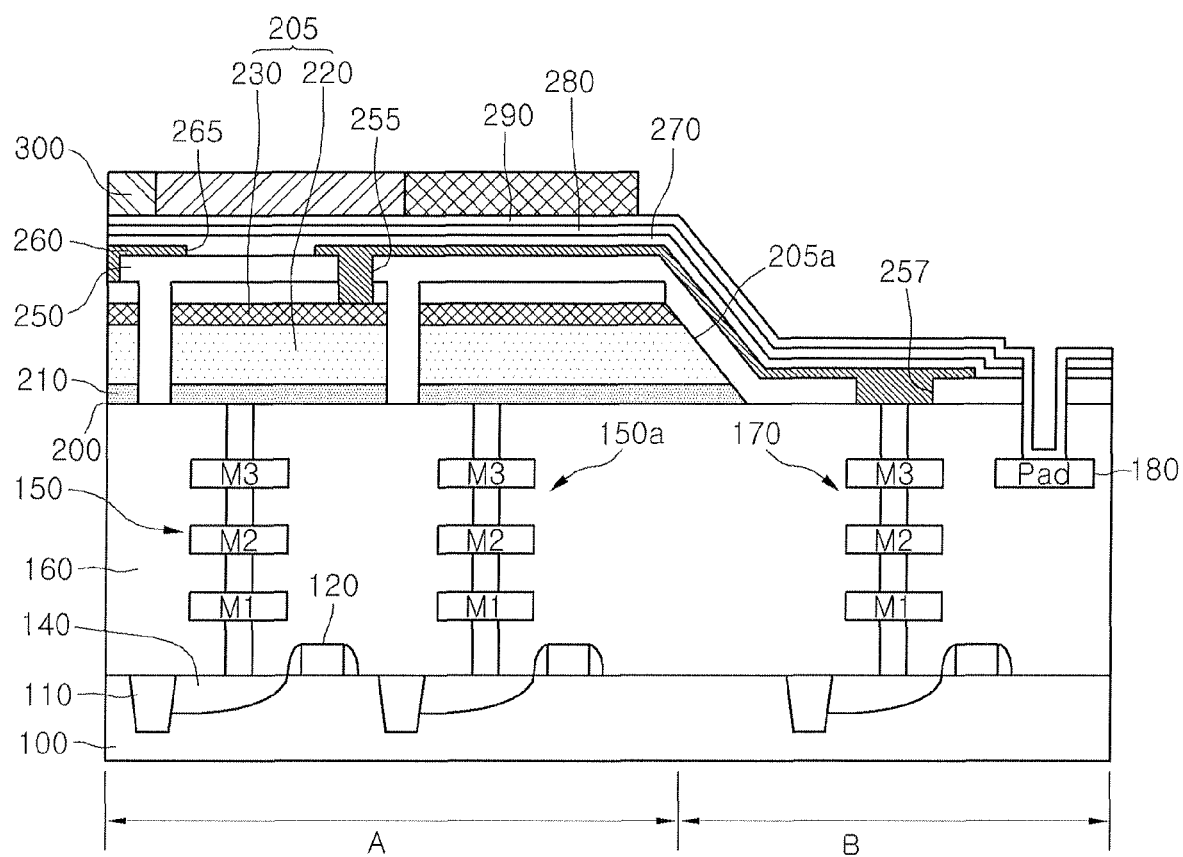

FIG. 16 is a cross-sectional view of an image sensor according to an embodiment.

The image sensor can include: a first substrate 100 including a pixel portion A in which a readout circuitry 120 is formed, and a peripheral portion B in which a peripheral circuit is formed; an interlayer dielectric 160 formed on the first substrate 100 with lines 150 and 150a to connect with the readout circuitry 120 and line 170 to connect with the peripheral circuit; a crystalline semiconductor layer 200 on a portion of the interlayer dielectric 160 corresponding to the pixel portion A; a first photodiode 205 and a second photodiode 205a formed in the crystalline semiconductor layer 200, isolated for each unit pixel by a device isolation trench 235 (See FIG. 8), and respectively connected with the lines 150 and 150a; a device isolation layer 250 formed on the crystalline semiconductor layer 200 including the device isolation trench 235; an upper electrode layer 260 passing through the device isolation layer 250 to connect with a portion of the first photodiode 205; an expose portion 265 formed in the upper electrode layer 260 to selectively expose an upper region of the first photodiode 205; and a passivation layer 270 formed on the first substrate 100 and including in the expose portion 265.

The first photodiode 205 can be a main pixel electrically connected with the upper electrode layer 260 through a first via hole 255 to perform a substantial operation. The second photodiode 205a can be a dummy pixel not connected with the upper electrode layer 260. Since the second photodiode 205a serving as a dummy pixel can exclude a leakage factor of the upper electrode layer 260, it can be used as a reference pixel for measuring an exact leakage current. For example, the second photodiode 205a can be provided at an edge region of a chip.

A first passivation layer 270 and a second passivation layer 280 can be disposed on the first substrate 100 on which the upper electrode layer 260 is formed. The first passivation layer 270 can be formed on the device isolation layer 250 through the first expose portion 265 of the upper electrode layer 260.

The device isolation layer 250 can be formed in the crystalline semiconductor layer 200 to isolate the photodiode 205 for each unit pixel.

Also, the first passivation layer 270 and the second passivation layer 280 can be formed on the interlayer dielectric 160 on which the crystalline semiconductor layer 200 is formed to protect the photodiode 205 and the line 170 of the peripheral portion B.

Reference numerals not explained in FIG. 16 are explained in a manufacturing method below.

Hereinafter, a manufacturing method of an image sensor according to an embodiment is described with reference to FIGS. 1 to 16.

Figure 1:
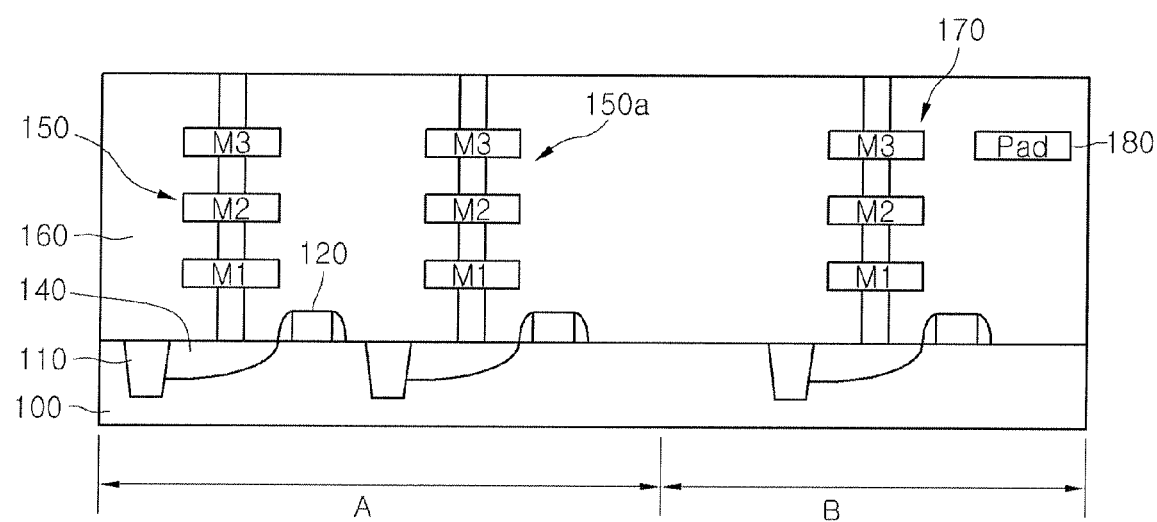
FIGS. 1 to 16 are cross-sectional views illustrating a manufacturing process of an image sensor according to an embodiment.

Referring to FIG. 1, readout circuitry and lines 150 and 150a can be formed on the pixel portion A of the first substrate 100.

The first substrate 100 can be a single crystal or polycrystal silicon substrate, and can be a substrate doped with p-type impurities or n-type impurities. A device isolation region 110 can be formed in the first substrate 100 to define an active region. The readout circuitry 120 including a transistor for each unit pixel can be formed in the active region.

The readout circuitry 120 and the line 150 are described in detail with reference to FIG. 2.

Figure 2:
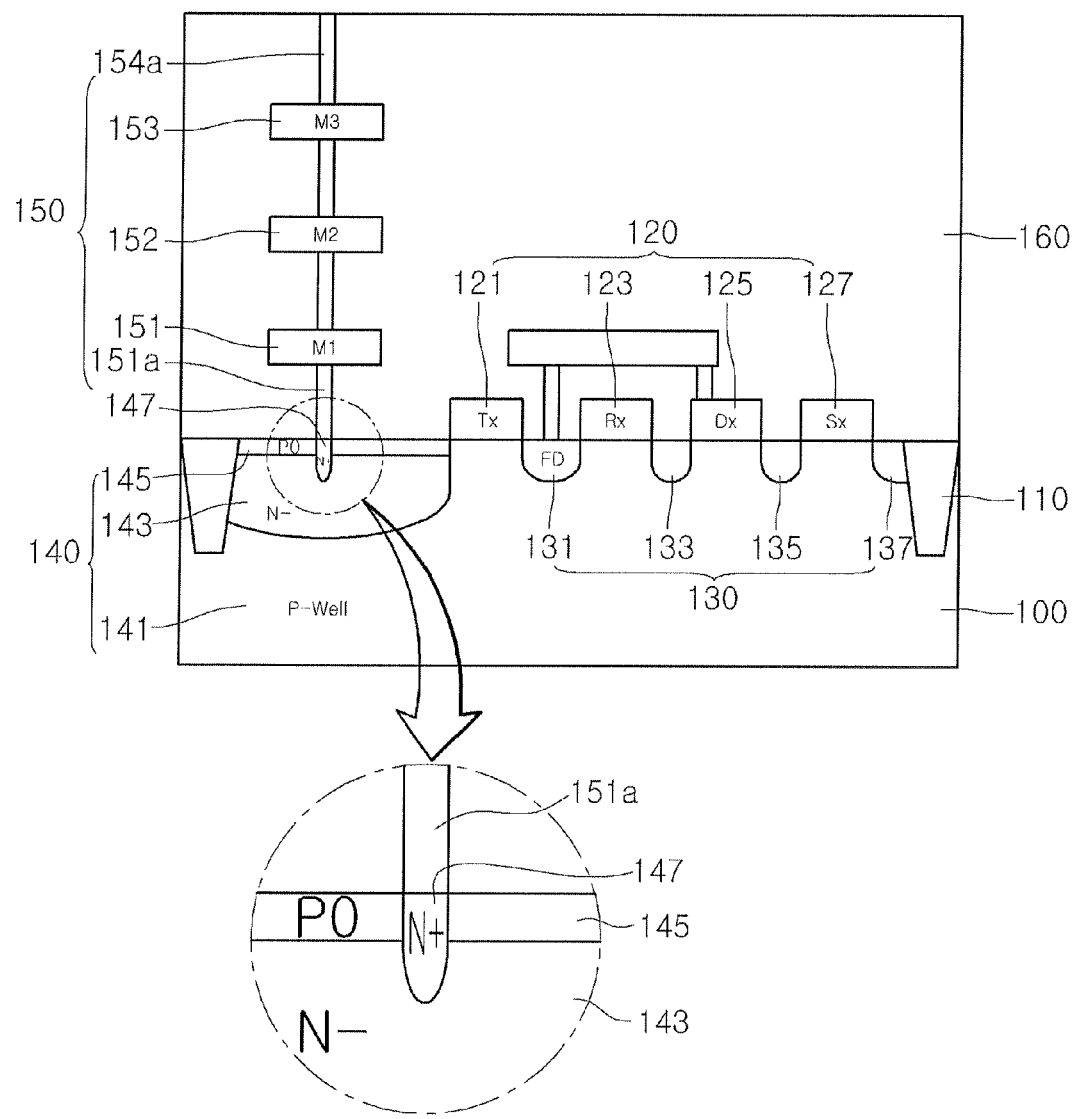

Referring to FIG. 2, the readout circuitry 120 can include a transfer transistor Tx 121, a reset transistor Rx 123, a drive transistor Dx 125, and a select transistor Sx 127. After forming gates for the transistors, ion implantation regions including a floating diffusion region FD 131, and source/drain regions 133, 135, and 137 of the respective transistors can be formed. Meanwhile, in various embodiments, the readout circuitry 120 can be one of 3Tr, 4Tr, and 5Tr.

Forming the readout circuitry 120 on the first substrate 100 can include forming an electrical junction region 140 in the first substrate 100, and forming a first conduction type connection region 147 connected with the line 150 on the electrical junction region 140.

For example, the electrical junction region 140 can be, but is not limited to, a PN junction 140. For example, the electrical junction region 140 can include a first conduction type ion implantation layer 143 formed on a second conduction type well 141 (or a second conduction type epitaxial layer), and a second conduction type ion implantation layer 145 formed on the first conduction type ion implantation layer 143. For example, the PN junction 140 can be, but is not limited to, a P0(145)/N− (143)/P− (141) junction as illustrated in FIG. 2. In one embodiment, the first substrate 100 can be doped with second conduction type impurities.

According to an embodiment, a device is designed such that a potential difference is generated between a source and drain of a transfer transistor Tx, so that a photo charge can be fully dumped. Accordingly, since a photo charge generated from the photodiode is fully dumped to a floating diffusion region, the sensitivity of an output image can be increased.

That is, according to an embodiment, the electrical junction region 140 is formed in the first substrate 100 where the readout circuitry 120 is formed to allow a potential difference to be generated between the source and the drain at the sides of the transfer transistor Tx 121, so that a photo charge can be fully dumped.

Hereinafter, a dumping structure of a photo charge according to an embodiment is described in detail.

Unlike a node of a floating diffusion FD 131, which is an N+ junction, the PNP junction 140, which is an electrical junction region 140 and to which an applied voltage is not fully transferred, is pinched-off at a predetermined voltage. This voltage is called a pinning voltage, which depends on the doping concentrations of P0 region 145 and N− region 143.

Specifically, an electron generated from the photodiode 205 moves to the PNP junction 140, and is transferred to the node of the floating diffusion FD 131 and converted into a voltage when the transfer transistor Tx 121 is turned on.

Figure 18:
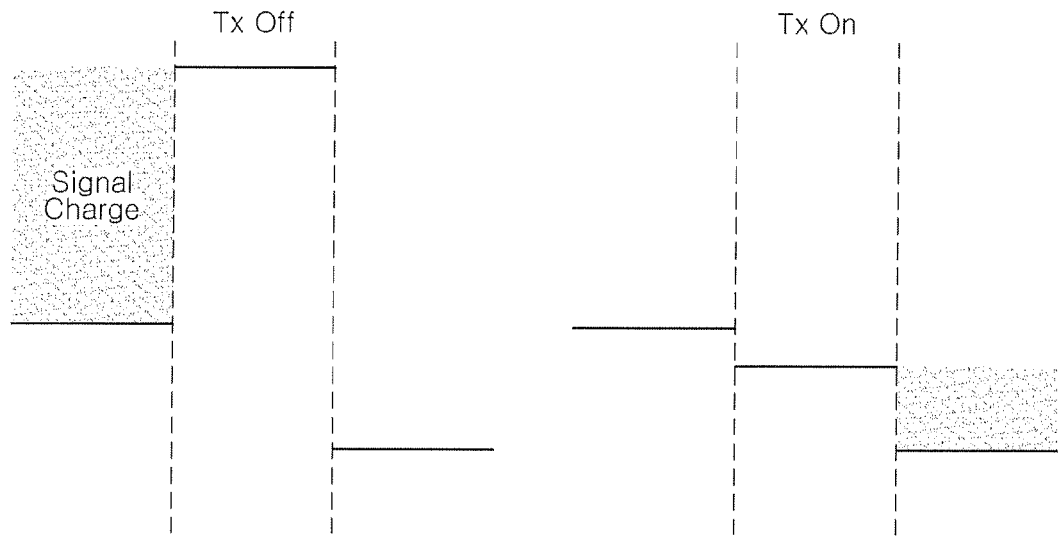
FIG. 18 is a view illustrating a photo charge dumping structure of a readout circuitry according to an embodiment.
Figure 19:
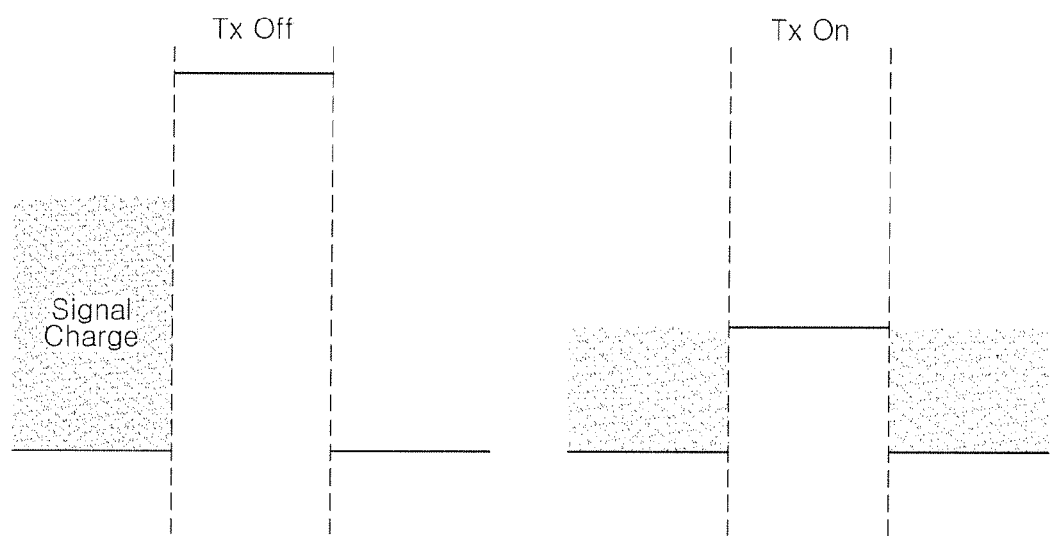
FIG. 19 is a view illustrating a photo charge dumping structure of a readout circuitry according to a related art.

Since a maximum voltage value of the P0/N−/P− junction 140 becomes a pinning voltage, and a maximum voltage value of the node of the floating diffusion FD 131 becomes Vdd minus a threshold voltage Vth of Rx 123, an electron generated from the photodiode 205 in the upper portion of a chip can be fully dumped to the node of the floating diffusion FD 131 without charge sharing by a implementing a potential difference between the sides of the transfer transistor Tx 121 as illustrated in FIG. 18.

That is, according to an embodiment, the P0/N−/P− well junction, not an N+/P-well junction, is formed in the first substrate to allow a + voltage to be applied to the N− region 143 of the P0/N−/P− well junction and a ground voltage to be applied to the P0 145 and P− well 141 during a 4-Tr active pixel sensor (APS) reset operation, so that a pinch-off is generated to the P0/N−/P− well double junction at a predetermined voltage or more as in a bipolar junction transistor (BJT) structure. This is called a pinning voltage. Therefore, a potential difference is generated between the source and the drain of the transfer transistor Tx 121 to fully dump a photo charge from the N− well to the floating diffusion FD 131 through the transfer transistor Tx and thus inhibit a charge sharing phenomenon during the on/off operations of the transfer transistor Tx.

Therefore, unlike a case where a photodiode is simply connected with an N+ junction as in a related art, limitations such as saturation reduction and sensitivity reduction can be avoided.

Next, a first conduction type connection region 147 can be formed between the photodiode and the readout circuitry to provide a swift movement path of a photo charge, so that a dark current source is minimized, and saturation reduction and sensitivity reduction can be inhibited.

For this purpose, an n+ doped region as the first conduction type connection region 147 for ohmic contact can be formed on the surface of the P0/N−/P− junction 140 according to an embodiment. The N+ region 147 can be formed to pass through the P0 145 to contact the N− region 143.

Meanwhile, to inhibit the first conduction type connection region 147 from becoming a leakage source, the width of the first conduction type connection region 147 can be minimized. For this purpose, in one embodiment, a plug implant can be performed after etching a via hole for a first metal contact 151a. In another embodiment, ion implantation patterns (not shown) can be formed on the first substrate 100 and then the first conduction type connection region 147 can be formed using the ion implantation patterns as an ion implantation mask.

That is, a reason for locally and heavily doping only a contact forming portion with n-type impurities in this embodiment is to facilitate ohmic contact formation while minimizing a dark signal. In case of heavily doping the entire transfer transistor (Tx source) as in a related art, a dark signal may be increased by a Si surface dangling bond.

An interlayer dielectric 160 and line 150 can be formed on the first substrate 100. The line 150 can include the first metal contact 151a, a first metal 151, a second metal 152, a third metal 153, and a fourth metal contact 154a, but embodiments are not limited thereto.

The line 150 can be formed for each unit pixel to connect the photodiode 205 with the readout circuitry 120 to transfer a photo charge of the photodiode 205. While the line 150 connected with the readout circuitry 120 is formed, a line 170 connected with the peripheral portion B can also be formed. The lines 150 and 170 can be formed of various conductive materials including metal, an alloy, or silicide.

The lines 150 formed in the pixel portion A are formed for each unit pixel to transfer a photo charge of the photodiode to the readout circuitry 120. For example, the first line 150 of the pixel portion A is connected with a unit pixel performing a substantial operation, and the second line 150a can be connected with a dummy pixel. During the process step of forming the third metal 153 of the line 150, a pad 180 can be formed in the peripheral portion B.

Figure 3:
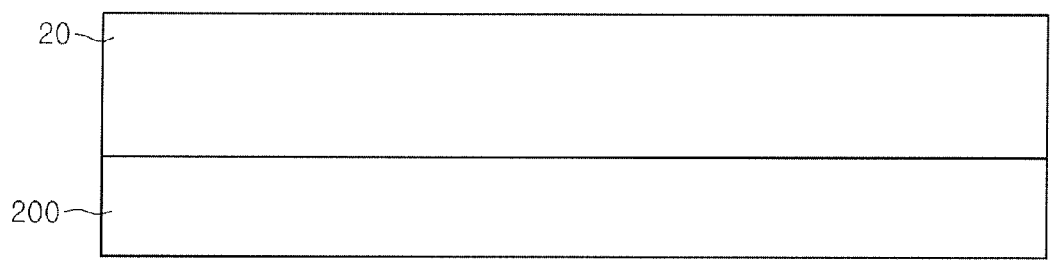

Referring to FIG. 3, a second substrate 20 including a crystalline semiconductor layer 200 can be prepared. The second substrate 20 is a single crystal or polycrystal silicon substrate, and can be a substrate doped with p-type impurities or n-type impurities. The crystalline semiconductor layer 200 can be formed by performing an epitaxial process on the second substrate 20.

Figure 4:
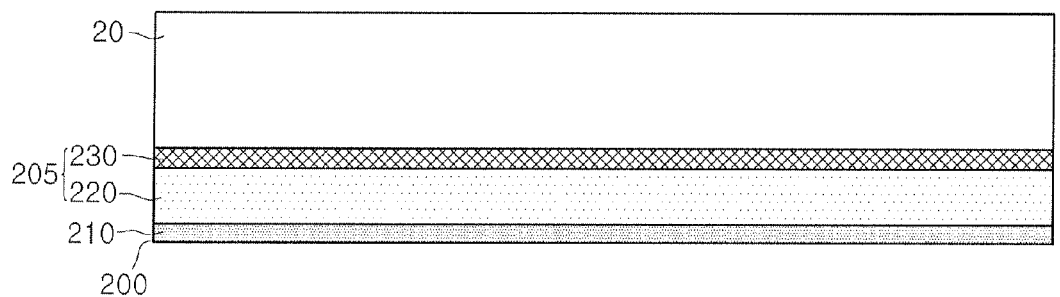

Referring to FIG. 4, a photodiode layer 201 can be formed in the crystalline semiconductor layer 200. The photodiode layer 201 can be formed by making an n-type first impurity region 220 and a p-type second impurity region 230 in the crystalline semiconductor layer 200 through ion implantation. Accordingly, a PN junction can be formed in the crystalline semiconductor layer 200.

Also, an ohmic contact layer 210 can be formed by implanting high concentration n-type impurities into the surface of the first impurity region 220.

According to an embodiment, since the first impurity region 220 is formed thicker than the second impurity region 230, a charge storing capacity can be increased. That is, the N− layer is formed thicker to extend an area for depletion, so that capacity that can accommodate a photo charge can be improved.

Though not shown, a hydrogen ion layer can be formed between the crystalline semiconductor layer 200 and the second substrate 20. Alternatively, a dielectric may be buried between the crystalline semiconductor layer 220 and the second substrate 20. The dielectric can be removed through a wet etching process after the second substrate 20 is removed. The hydrogen ion layer and the dielectric are intended for separating the second substrate from the crystalline semiconductor layer 200.

Figure 5:
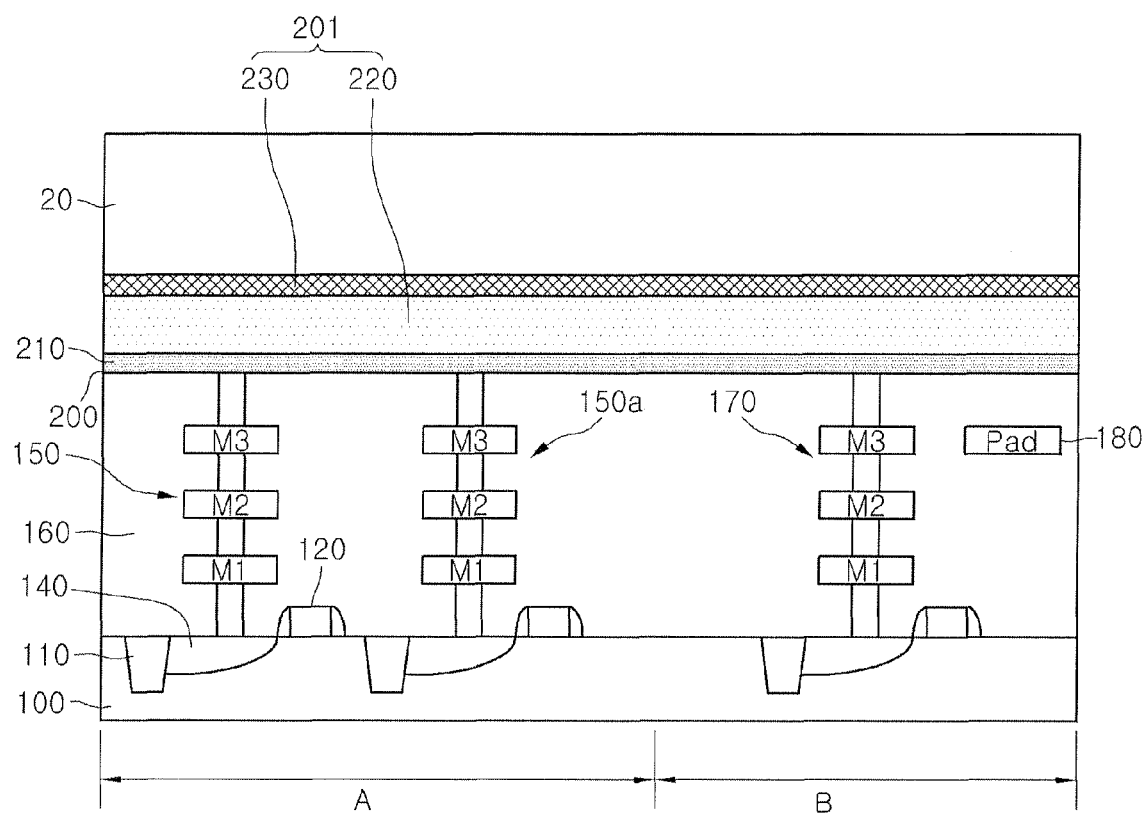

Referring to FIG. 5, the first substrate 100 and the second substrate 20 including the crystalline semiconductor layer 200 are bonded to each other. The surface of the ohmic contact layer 210 can be disposed on the interlayer dielectric 160, which is the surface of the first substrate 100, and then the bonding is performed. Then, the lower line 150 and the ohmic contact layer 210 are electrically connected.

Figure 6:
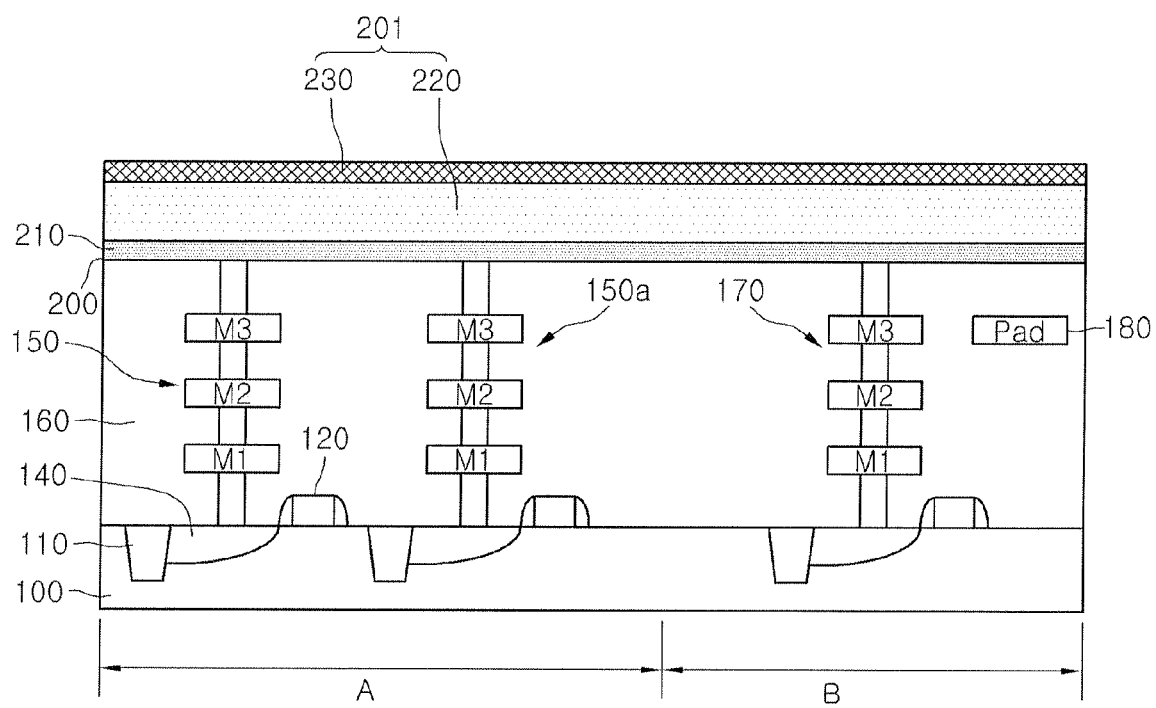

Referring to FIG. 6, the second substrate 20 can be removed to expose the photodiode layer 201. That is, when the second substrate 20 is removed, the crystalline semiconductor layer 200 of a thin film remains on the first substrate 100. For example, the second substrate 20 can be removed using a blade or a chemical mechanical polishing (CMP) process using a hydrogen ion layer (not shown) or a dielectric layer (not shown) as a reference.

Figure 7:
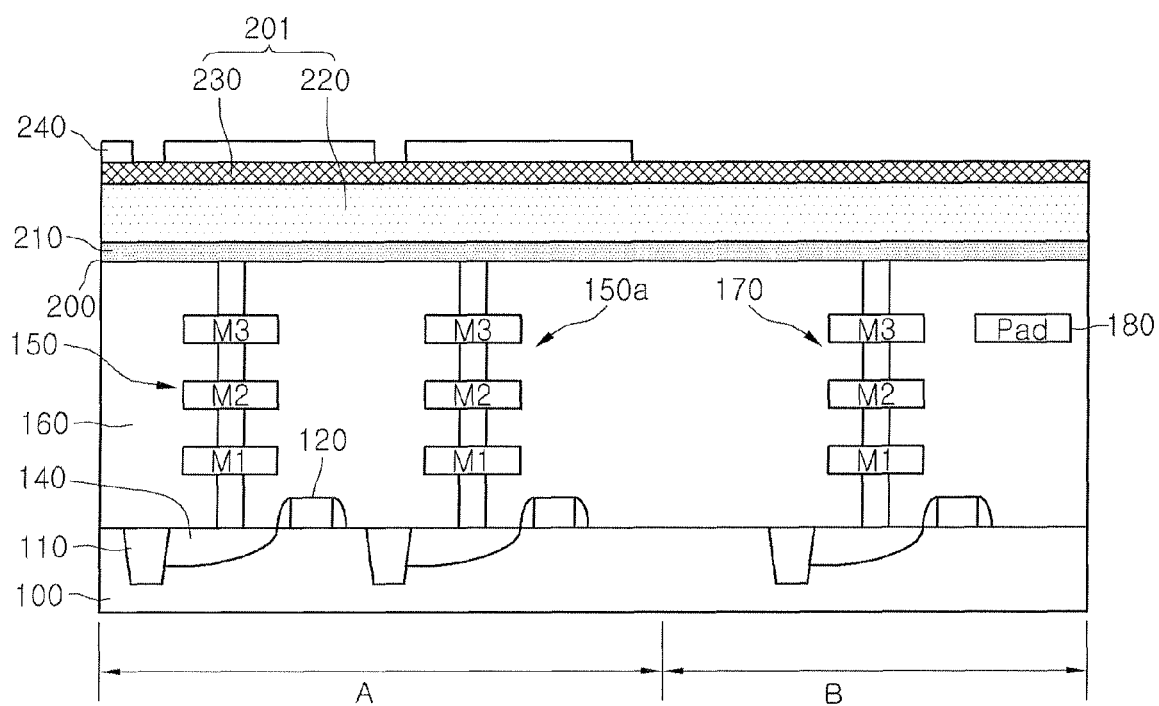

Referring to FIG. 7, device isolation patterns 240 can be formed on the crystalline semiconductor layer 200. The device isolation patterns 240 can be formed by forming a dielectric such as an oxide layer on the photodiode layer 201 and then patterning the same, so that it can selectively expose the crystalline semiconductor layer 200. Also, the device isolation patterns 240 can expose a portion of the crystalline semiconductor layer 200 corresponding to the peripheral portion B.

Figure 8:
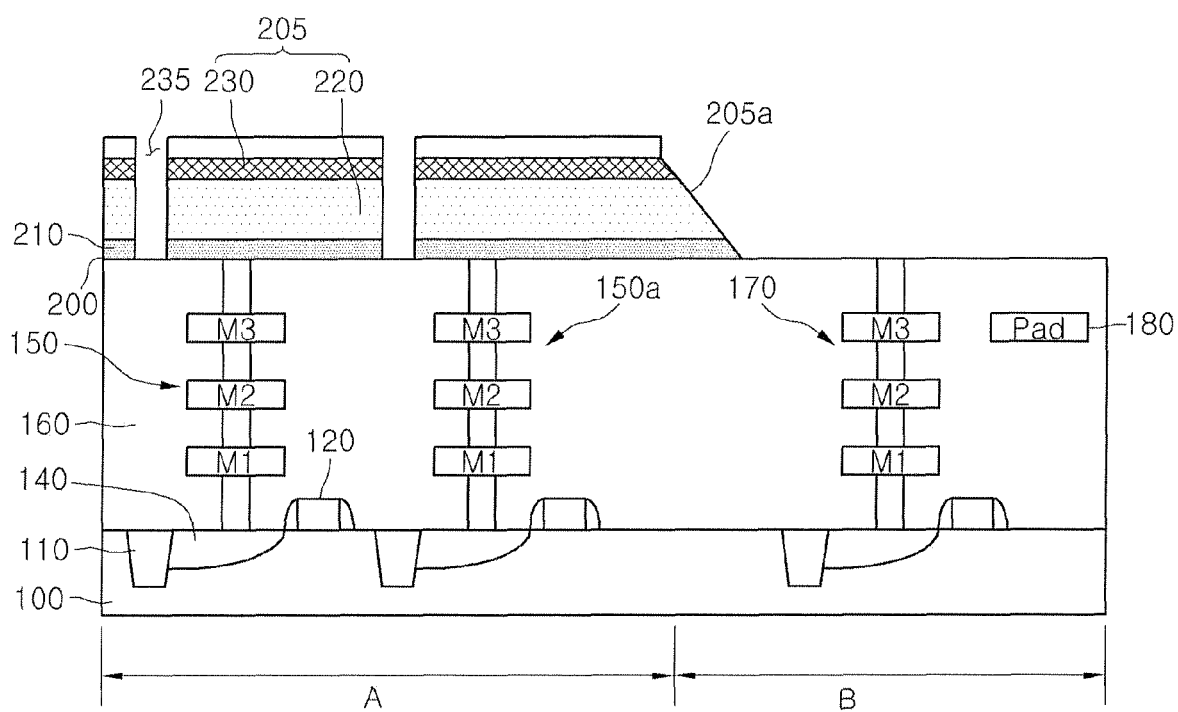

Referring to FIG. 8, device isolation trenches 235 can be formed in the crystalline semiconductor layer 200. The device isolation trenches 235 can be formed by selectively etching the crystalline semiconductor layer 200 using the device isolation patterns 240 as an etch mask. By doing so, the photodiode layer 201 in the pixel portion A is isolated by the device isolation trenches 235 and can be connected with the line 150 separated for each unit pixel.

That is, the first photodiode 205 connected with the line 150 can be a unit pixel that substantially operates, and the second photodiode 205a connected with the line 150a can be a dummy pixel. Also, while the isolation trenches for defining first and second photodiodes 205 and 205a are formed, a portion of the crystalline semiconductor layer 200 in the peripheral portion B is removed, so that a portion of the interlayer dielectric 160 and the line 170 in the peripheral portion B are exposed.

Figure 9:
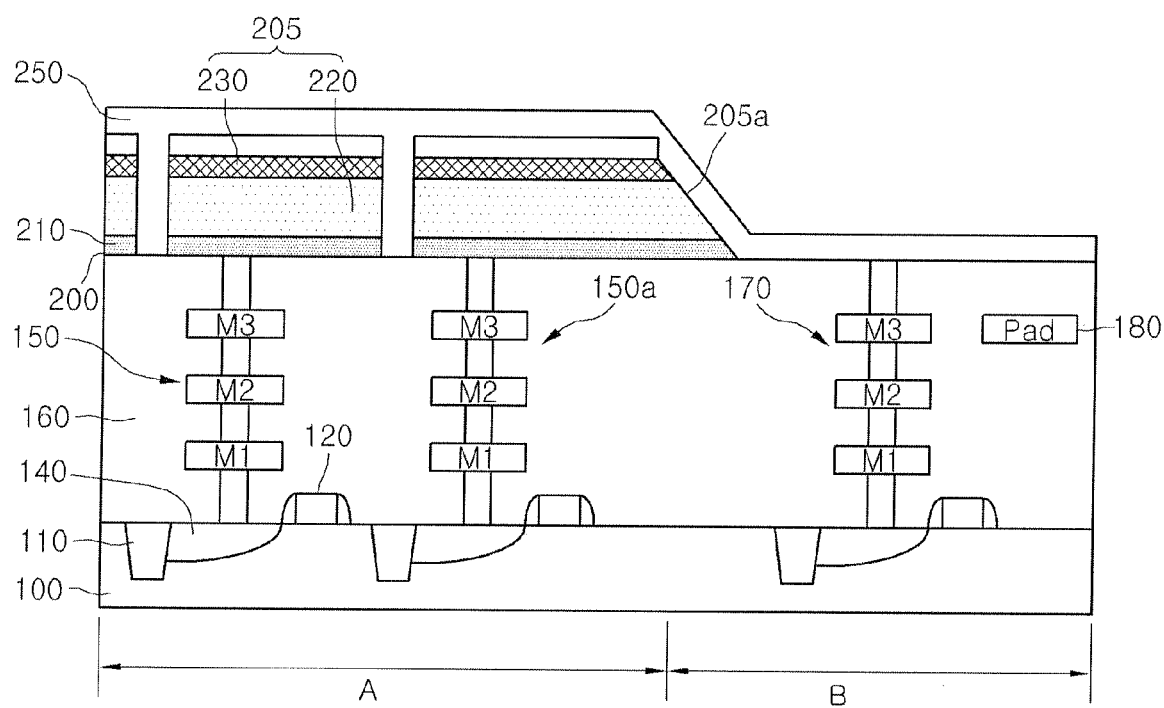

Referring to FIG. 9, a device isolation layer 250 can be formed on the first substrate 100 on which the device isolation trenches 235 are formed. The device isolation layer 250 can be formed using a transparent dielectric such as an oxide layer. Since the device isolation layer 250 is formed on the interlayer dielectric 160 while filling the insides of the device isolation trenches 235, the first and second photodiodes 205 and 205a can be isolated from each other. Also, since the device isolation layer 250 is formed over the entire surface of the interlayer dielectric 160, it can protect the first and second photodiodes 205 and 205a, and the line 170 in the peripheral portion B.

Figure 10:
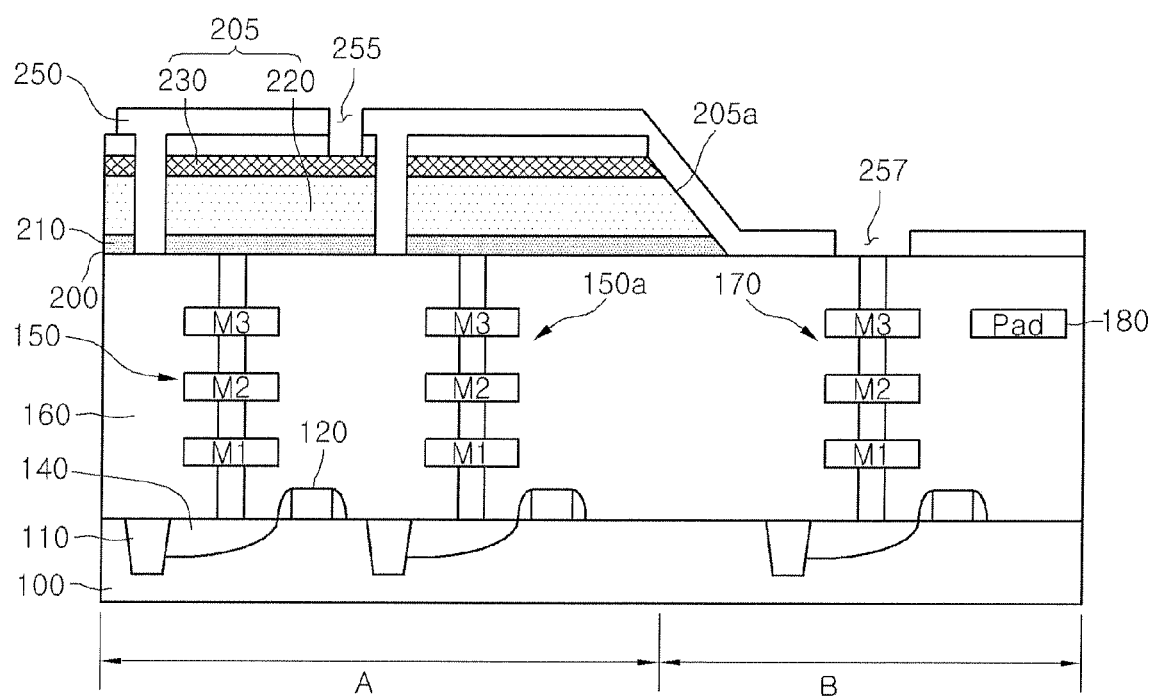

Referring to FIG. 10, first and second via holes 255 and 257 can be formed in the device isolation layer 250. The first and second via holes 255 and 257 can be formed by removing portions of the device isolation layer 250, and can expose a partial surface of the first photodiode 205 and the line 170, respectively.

Figure 11:
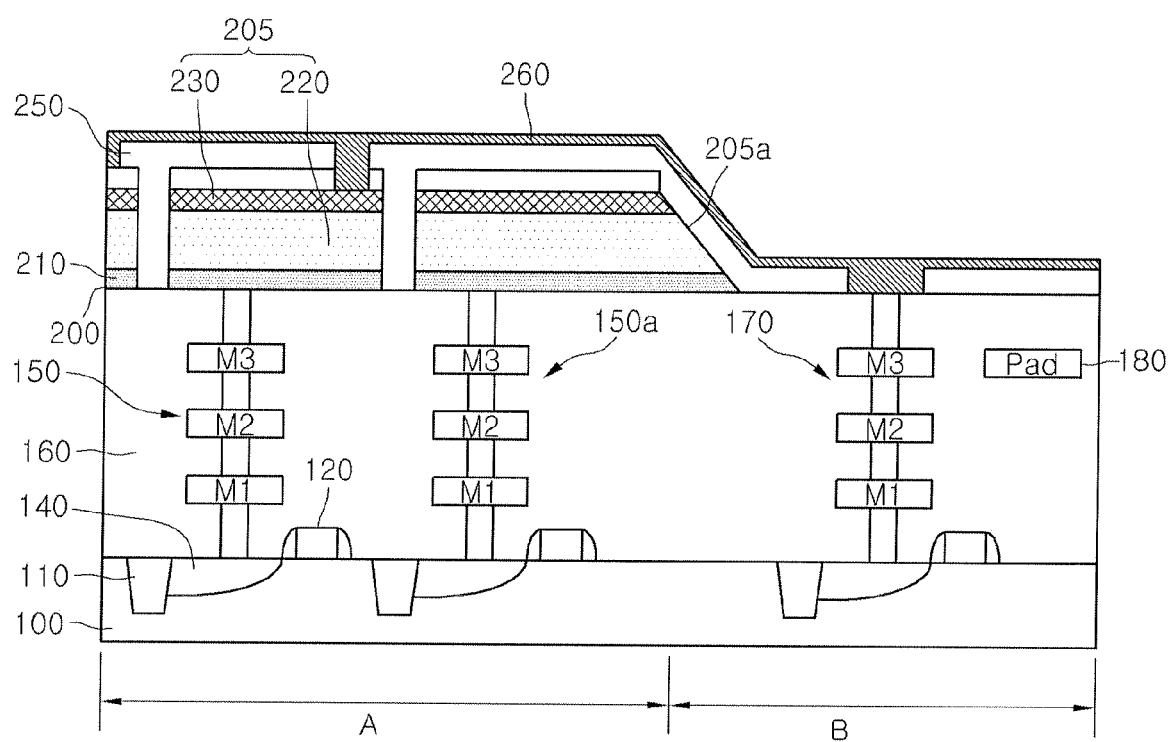

Referring to FIG. 11, an upper electrode layer 260 can be formed on the device isolation layer 250 including in the first and second via holes 255 and 257. The upper electrode layer 260 can be formed by depositing a conductive material on the device isolation layer 250 including the first and second via holes 255 and 257. For example, the upper electrode layer 260 can be formed of an opaque metal layer such as Ti, Al, Cu, Co, and W.

The upper electrode layer 260 can be electrically connected, through the first via hole 255, with the first photodiode 205 isolated for each unit pixel. Also, the upper electrode layer 260 can be electrically connected, through the second via hole 257, with the line 170 in the peripheral portion B. The upper electrode layer 260 extends from the first via hole 255 to the second via hole 257 to screen the upper surface of the second photodiode 205a. Therefore, light directed to the second photodiode 205a can be blocked by the upper electrode layer 260.

The upper electrode layer 260 is connected to only the first photodiode 205 (not the second photodiode 205a), so that the first photodiode 205 performs a substantial operation. Also, since the upper electrode layer 262 is not electrically connected with the second photodiode 205a, the second photodiode 205a can serve as a dummy pixel. Generally, a leakage current factor during measurement of a leakage current may be due to a lower line and an upper line. According to an embodiment, where a leakage current of the line 150 is not generated, the dummy pixel is not connected with the upper electrode layer 260, which is a reset line, so that a leakage current factor of the reset line can be excluded and thus an accurate measurement of a leakage current can be made. Since this leakage current has a direct influence on a dark signal, the second photodiode 205a is used as the dummy pixel, so that the second photodiode 205a can be used as a reference pixel for a dark signal.

Also, since the upper electrode layer 260 serves as a blocking layer of the second photodiode 205a, differences in signals due to temperature in the inside and the outside are compared, so that an output image associated with a hot pixel can be improved.

Figure 12:
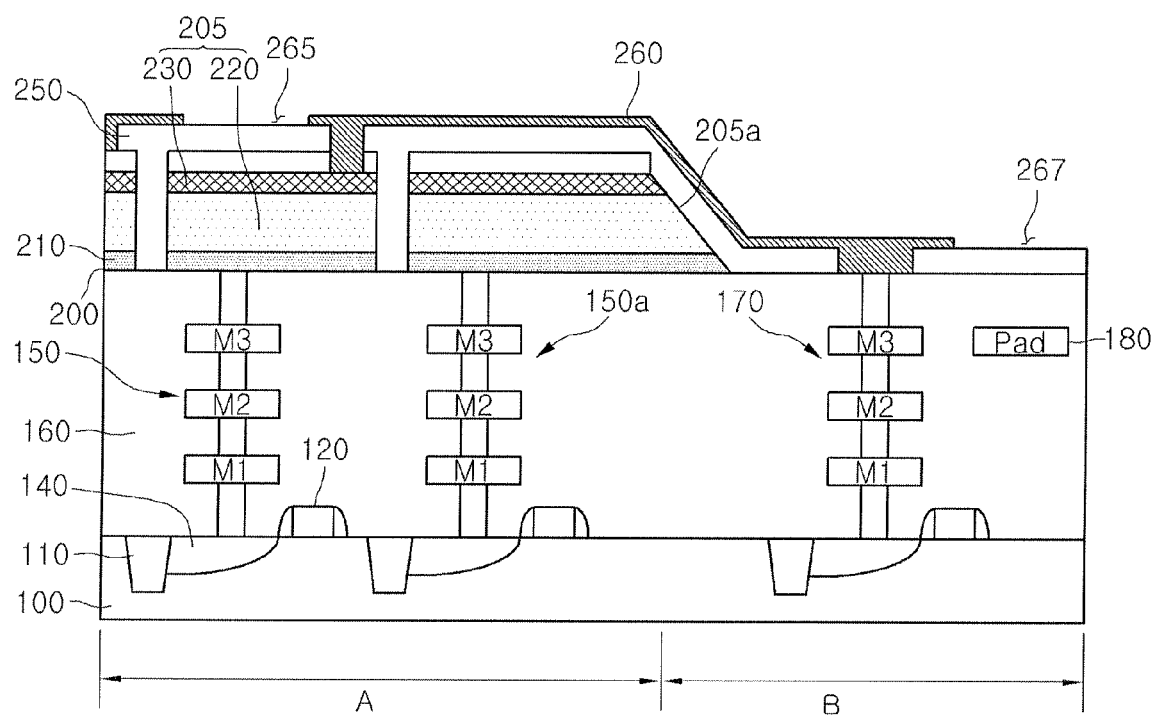

Referring to FIG. 12, a first expose portion 265 can be formed in the upper electrode layer 260 to expose a light receiving region of the first photodiode 205 formed for each unit pixel. The first expose portion 265 can secure the light receiving region of the first photodiode 205 by removing a portion of the upper electrode layer 260 corresponding to the first photodiode 205 formed for each unit pixel.

Also, while the first expose portion 265 is formed, a second expose portion 267 exposing a portion of the device isolation layer 250 corresponding to the pad 180 can be formed.

Figure 13:
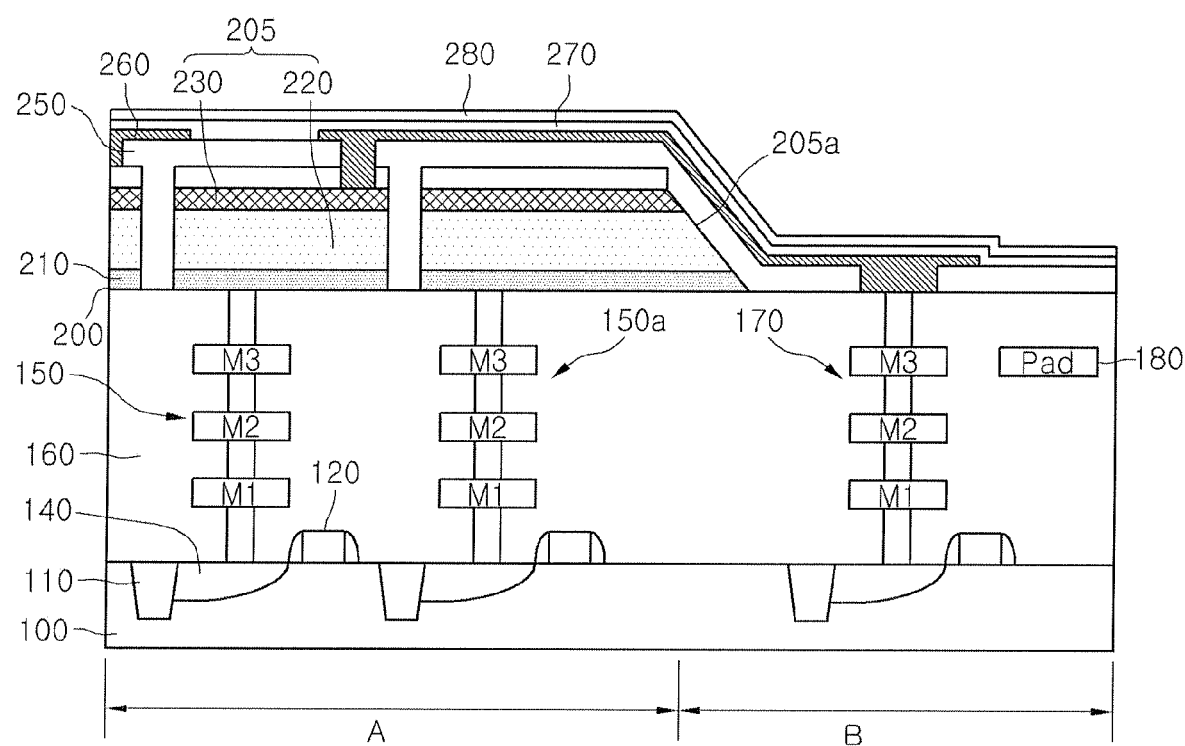

Referring to FIG. 13, a first passivation layer 270 and a second passivation layer 280 can be formed on the interlayer dielectric 160 on which the first expose portion 265 and the second expose portion 267 are formed. The first passivation layer 270 can contact the device isolation layer 250 through the first expose portion 265. In certain embodiments, the first passivation layer 270 can be an oxide layer or a nitride layer. In addition, the second passivation layer 280 can be a nitride layer or an oxide layer.

Figure 14:
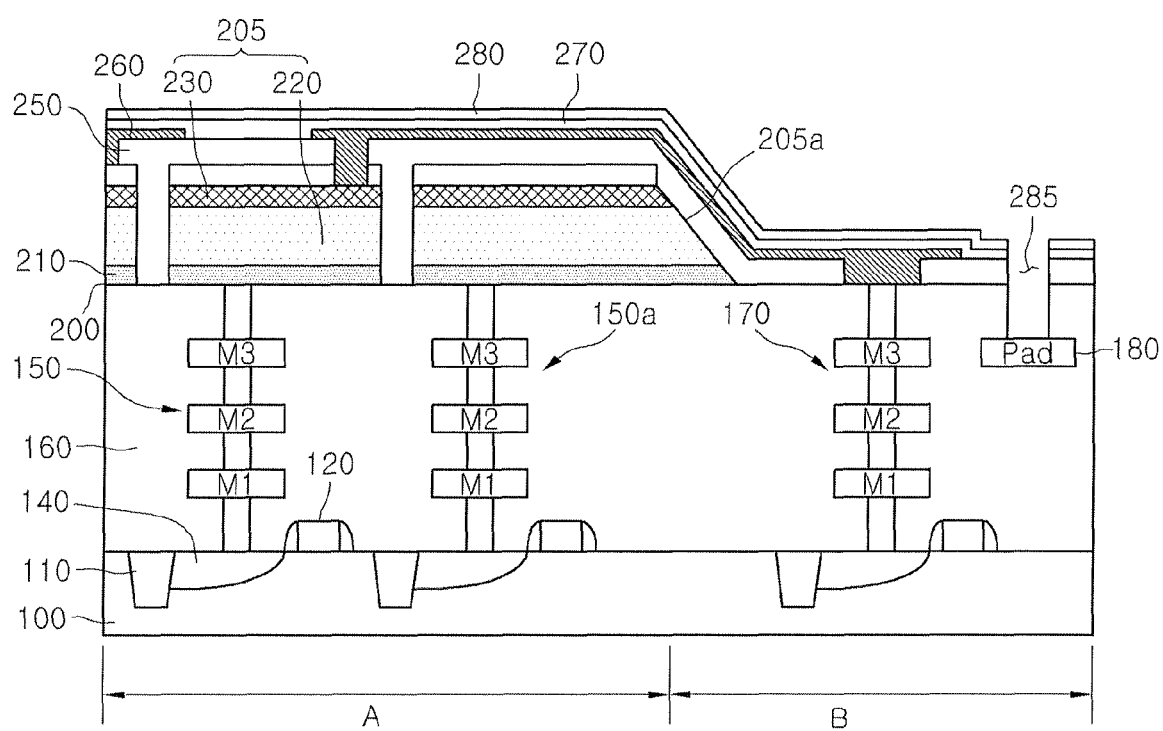

Referring to FIG. 14, a pad hole 285 exposing the pad 180 in the peripheral portion B can be formed. The pad hole 285 can expose the pad 180 by removing portions of the interlayer dielectric 160, the device isolation layer 250, the first passivation layer 270, and the second passivation layer 280 corresponding to the pad 180.

Figure 15:
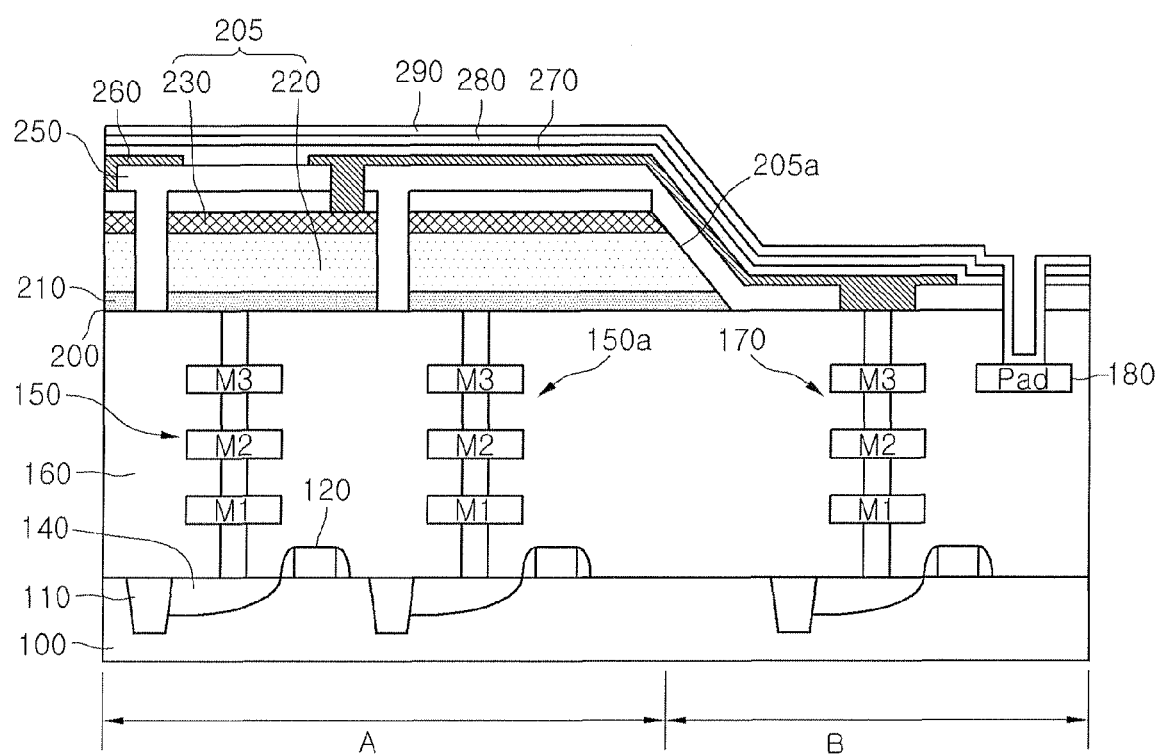

Referring to FIG. 15, a pad passivation layer 290 can be formed on the interlayer dielectric 160 in which the pad hole 285 is formed. The pad passivation layer 290 is intended for inhibiting the pad 180 from being contaminated during subsequent processes of forming color filters 300 and microlenses (not shown). For example, the pad passivation layer 290 can be a tetra ethyl ortho silicate (TEOS) layer having a thickness of about 10-200 Å.

Referring to FIG. 16, color filters 300 and microlenses (not shown) can be formed on portions of the pad passivation layer 290 corresponding to the first and second photodiodes 205 and 205a. One color filter 300 can be formed for each unit pixel to separate color from incident light.

Figure 17:
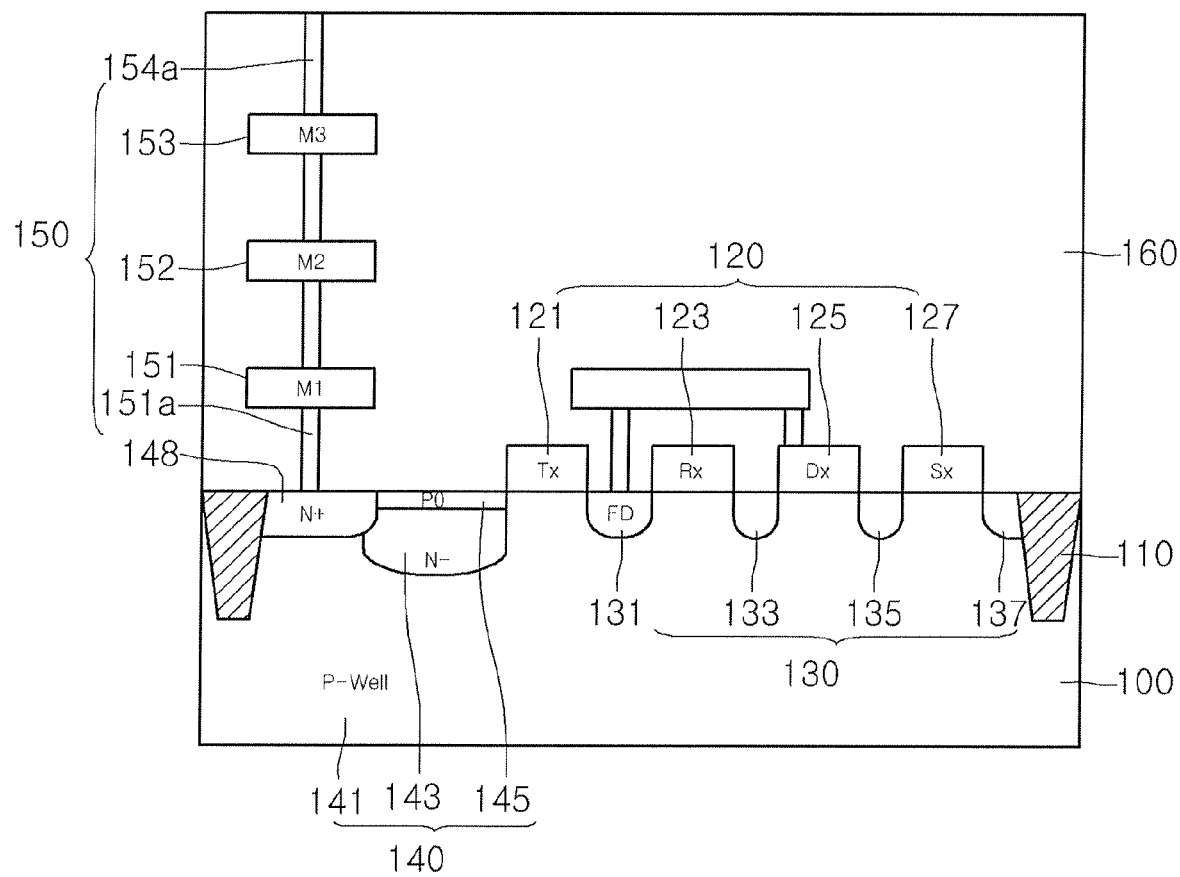
FIG. 17 is a partial detailed view of an image sensor according to another embodiment.

FIG. 17 is a partial detailed view of an image sensor according to another embodiment.

Referring to FIG. 17, the image sensor can include: a first substrate 100 in which a readout circuitry 120 is formed; a line 150 formed on the first substrate 100 such that it is electrically connected with the readout circuitry 120; and a photodiode (not shown) electrically connected with the line 150 and formed in a crystalline semiconductor layer on the first substrate 100.

This embodiment can adopt the technical characteristics of the embodiments described with respect to FIGS. 2 to 16.

For example, each first photodiode 205 can be isolated according to unit pixel by a device isolation trench 235 and a device isolation layer 250. Also, a passivation layer 270 can be formed on an interlayer dielectric 160 on which the first photodiode 205 is formed to protect the photodiode 205 and other devices. Also, a second photodiode 205a, which is a dummy pixel not electrically connected with an upper electrode layer 260, can be formed to measure a leakage current.

Meanwhile, unlike an embodiment described above, the embodiment as shown in FIG. 17 illustrates a first conduction type connection region 148 formed at a side of the electrical junction region 140.

According to an embodiment, an N+ connection region 148 for ohmic contact can be formed at the P0/N−/P− junction 140. At this point, a process of forming the N+ connection region 148 and an M1C contact 151a may provide a leakage source because the device operates with a reverse bias applied to the P0/N−/P− junction 140 and so an electric field EF can be generated on the Si surface. A crystal defect generated during the contact forming process inside the electric field serves as a leakage source.

Also, in the case where the N+ connection region 148 is formed on the surface of the P0/N−/P− junction 140, an electric field due to the N+/P0 junction 148/145 is added. This electric field also serves as a leakage source.

Therefore, this embodiment proposes a layout in which a first contact plug 151a is formed in an active region not doped with a P0 layer, but including an N+ connection region 148. Then, the first contact plug 151a is connected with the N− junction 143 through the N+ connection region 148.

According to embodiments, the electric field is not generated on the Si surface, which can contribute to reduction in a dark current of a 3D integrated CIS.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing an image sensor, the method comprising:

forming a readout circuitry on a pixel portion of a first substrate, and a peripheral circuitry on a peripheral portion of the first substrate;

forming an interlayer dielectric including first lines connected with the readout circuitry and a second line connected with the peripheral circuitry on the first substrate;

forming a second substrate comprising a crystalline semiconductor layer;

forming a photodiode layer in the crystalline semiconductor layer;

bonding the first substrate with the second substrate comprising the photodiode layer;

removing a portion of the second substrate to expose the photodiode layer on the first substrate;

forming device isolation trenches in the crystalline semiconductor layer separating regions of the photodiode layer to form a first photodiode and a second photodiode respectively connected with the first lines;

forming a device isolation layer on the crystalline semiconductor layer including in the device isolation trenches;

forming an upper electrode layer on the device isolation layer such that the upper electrode layer is connected with a portion of the first photodiode;

removing a portion of the upper electrode layer to form an expose portion selectively exposing an upper region of the first photodiode; and forming a passivation layer on the interlayer dielectric on which the expose portion is formed.

2. The method according to claim 1, wherein during forming the device isolation trenches, a portion of the crystalline semiconductor layer corresponding to the peripheral portion is removed, so that a line in the peripheral portion is exposed.

3. The method according to claim 1, wherein the forming of the upper electrode layer comprises:

forming a first via hole in a portion of the device isolation layer on the crystalline semiconductor layer to expose a partial surface of the first photodiode; and forming a metal layer on the device isolation layer including in the first via hole.

4. The method according to claim 3, further comprising forming a second via hole exposing a line in the peripheral portion while the first via hole is formed, the upper electrode layer being electrically connected with the line of the peripheral portion through the second via hole.

5. The method according to claim 1, wherein the forming of the readout circuitry in the first substrate comprises forming an electrical junction region in the first substrate, wherein the forming of the electrical junction region in the first substrate comprises:

forming a first conduction type ion implantation region in the first substrate; and forming a second conduction type ion implantation region on the first conduction type ion implantation region.

6. The method according to claim 5, further comprising forming a first conduction type connection region connected with one of the first lines on the electrical junction region.

7. The method according to claim 6, wherein the forming of the first conduction type connection region is performed after performing a contact etch for one of the first lines.

8. The method according to claim 5, further comprising forming a first conduction type connection region connected with one of the first lines at a side of the electrical junction region.

9. The method according to claim 8, wherein the first conduction type connection region is formed between a device isolation region formed in the first substrate and the electrical junction region and contacts the device isolation region formed in the first substrate and the electrical junction region.

* * * * *